INVENTORS A. R. HUTSON
P. K. TIEN
BY Wilford L. Wisner
ATTORNEY

United States Patent Office 3,440,425
Patented Apr. 22, 1969

3,440,425
GUNN-EFFECT DEVICES

Andrew R. Hutson, Summit, and Ping K. Tien, Chatham Township, Morris County, N.J., assignors to Bell Telephone Laboratories, Incorporated, New York, N.Y., a corporation of New York Filed Apr. 27, 1966, Ser. No. 545,756
Int. Cl. H04b 9/00
U.S. Cl. 250—199 7 Claims

ABSTRACT OF THE DISCLOSURE

Controllable microwave oscillations are shown to be producible in negative conductance semiconductive devices biased by a near-threshold direct-current voltage and illuminated by light in a wavelength range that produces free electron energy absorption without exciting lattice vibrations. In a frequency-shifting detector a bias of about 3,000 volts per centimeter is applied to a gallium arsenide device and the amplitude-modulated illumination is converted to an amplitude-modulated microwave output that is readily detected. In two other embodiments, the microwave oscillator frequency is varied either by controlling the intensity of the illumination so that the direct-current voltage may be varied or by scanning a narrow region of illumination across the device to control its effective length.

This invention relates to devices employing negative conductance instabilities in semiconductors. Such instabilities in certain compound semiconductors are called "Gunn-effect" oscillations.

Gunn-effect oscillations are those oscillations that occur spontaneously in two-valley compound semiconductors, such as gallium arsenide, upon application of a direct-current biasing voltage gradient above a threshold level. In gallium arsenide, the threshold level is about 3,000 volts per centimeter of displacement between the electrodes; and the oscillations typically have a frequency in the high microwave range for presently practical sample lengths.

Particularly appealing aspects of Gunn-effect oscillations are the simplicity of the apparatus employed to produce the oscillations and the potential usefulness of the oscillations. In the frequency range of the typical Gunn-effect devices, a wide range of communication devices are available. Thus, a Gunn-effect oscillator may be a convenient oscillator for use in otherwise conventional systems.

Many of the possible applications depend on the solution to one or both of two technical problems concerning Gunn-effect oscillations. The first problem involves the extremely high value of the threshold voltage gradient, which introduces various complexities. The second problem involves the need for a technique for easily and quickly tuning the frequency of oscillations.

According to our invention, we have recognized that any desired portion of the direct-current bias voltage heretofore needed for Gunn-effect oscillation can be replaced by light in appropriate wavelength ranges. As used herein, the term light can include electromagnetic waves in the infrared and far infrared as well as the visible portion of the spectrum. The appropriate wavelength ranges are those in which free carrier absorption predominates. For example, one such range lies between the range of the fundamental bandgap and the range in which the material is highly reflecting due to excitation of the infrared lattice vibrations by the light. Another range lies at longer wavelengths than the infrared lattice vibrations. For a gallium arsenide oscillator crystal, the permissible wavelength ranges of the light extend from about 4 microns to about 35 microns and from about 42 microns to longer wavelengths.

We have recognized that, by making free carrier absorption the largely predominant mechanism of absorption, the light heats up the electrons of the crystal in the same way as does the applied direct-current biasing voltage. Since this heating, or agitation, of the electrons is fundamentally important to Gunn-effect oscillations, free carrier absorption of light can supplement or replace direct-current biasing voltage in producing Gunn-effect oscillations.

One embodiment of our invention comprises means for applying amplitude-modulated light of the appropriate wavelength to the crystal and means for detecting the resultant amplitude modulation of the oscillations. This embodiment can be employed as a sensitive, fast optical detector.

Another embodiment of our invention comprises a device in which light of the appropriate wavelength is employed to maintain oscillations, the device including means for varying the direct-current bias voltage to tune the Gunn-effect oscillations over a wide frequency range and particularly to reduce the frequency thereof as compared to the prior art devices. The frequency of Gunn-effect oscillations depends directly upon the value of the direct-current biasing voltage and can be reduced when a portion of the prior art threshold voltage is replaced by free carrier absorption to a degree sufficient to maintain oscillations. In prior art devices, the lower the frequency the longer the sample needs to be. Not only is it difficult to make long samples of adequate uniformity, but also such prior art devices are still not readily tunable, over a significant range.

Still another embodiment of our invention comprises a Gunn-effect device including means for directing the light in a beam sufficiently narrow to nucleate a so-called dipole layer, i.e., a region in which the Gunn-effect oscillation starts, and means for scanning the light beam along the oscillator crystal. In this case, the frequency of Gunn-effect oscillation is determined by the spacing between the nucleated layer and the device anode. We control the frequency of oscillation in this embodiment by scanning the light beam along the crystal in a direction extending between the anode and cathode. Further, this embodiment of the invention becomes a digital device, i.e., a pulse-to-tone converter, if the light beam is deflected in discrete steps.

Further features and advantages of our invention will become apparent from the following detailed description, taken together with the drawing, in which.

Figure 1:
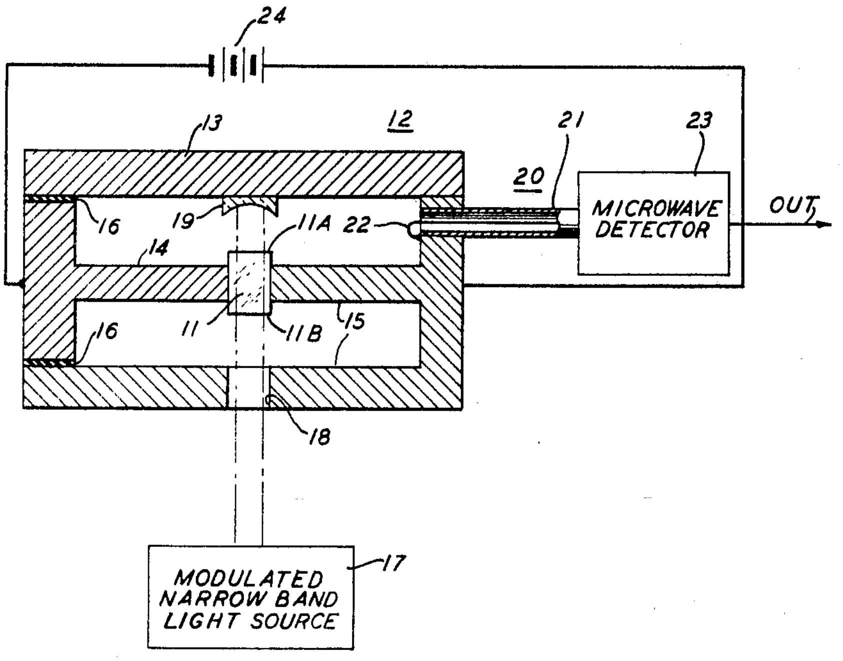
FIG. 1 is a partially pictorial and partially schematic illustration of an embodiment of the invention employed as an optical detector.

In the embodiment of FIG. 1, a device according to our invention is employed as an optical detector. This embodiment converts amplitude-modulation of the light to amplitude-modulation of a microwave oscillation and then detects the amplitude modulation of the microwave oscillation. A conventional microwave detector can perform the latter function with a sensitivity of $1\times10^{-12}$ watts.

In FIG. 1 a crystal 11 of gallium arsenide (GaAs) in the form of a rectangular parallelopiped is employed as the body of material in which Gunn-effect oscillations are to be produced. The crystal can be of the type used hitherto for producing such oscillations. The crystal 11 is mounted in the interior of a microwave cavity resonator 12, which includes the three members 13, 14, and 15.

The members 13 and 15 form most of the exterior walls of the cavity; and member 14 forms the remainder of the exterior walls. The cavity is divided into two internal regions by arms of the members 14 and 15. These arms form a sort of septum in the cavity. The crystal 11 is supported between arms of the members 14 and 15 and also serves to insulate them from one another. Suitable insulating layers 16 insulate the member 14 from the member 13 and 15 at the respective regions of mutual support. The arms of members 14 and 15 that support the crystal 11 serve to divide resonator 12 into two portions respectively surrounding two opposed free ends 11A and 11B of the crystal 11, which are ground to be optically flat and parallel and are antireflection coated with suitable dielectric materials for the wave length of light from the narrow band light source 17.

An aperture 18 is drilled in the member 15 to admit a collimated beam of light from source 17 to one of the flat end surfaces 11B of the crystal 11. Spherically concave reflector 19 is mounted upon a wall of the member 13 and is faced toward the opposite end surface 11A of crystal 11 in order to reflect the portion of light transmitted through crystal 11 in the reverse direction of propagation.

The output coupling apparatus 20 includes the coaxial cable 21, which includes inner and outer conductors entering the resonator between members 13 and 15 and an output coupling probe 22 connected between the inner and outer conductors and positioned within the cavity of the resonator 12. The outer conductor of the cable 21 makes electrical contact with both of the members 13 and 15. The cable 21 is connected to the input of a microwave detector 23 which provides an output signal which follows the modulation envelope of microwave oscillations occurring within resonator 12. A source 24 of direct-current biasing voltage is connected between the members 14 and 15. It should be clear that members 13 and 15 can be electrically common throughout their extent, if that is desired, so long as they are sufficiently insulated from the member 14.

The crystal 11 of gallium arsenide is advantageously a single crystal in the form of a rectangular parallelopiped 0.01 centimeter x 0.01 centimeter x 0.005 centimeter between the arms of members 14 and 15 and has a doping impurity level in the range between $1\times10^{-14}$ atoms per cubic centimeter and $1\times10^{-18}$, illustratively $1\times10^{-16}$ in the embodiment of FIG. 1, rendering it n-type. The dielectric coatings on its free end surfaces 11A and 11B are illustratively alternating layers of germanium and fluorine oxifluoride or germanium and zinc sulfide or germanium and barium. The material of the members 13, 14 and 15 of the resonator 12 are illustratively copper; and the arms of members 14 and 15 that support crystal 11 make good electrical contact to opposite sides thereof. That is, the direction of application of the electric field produced by the bias intersects the direction of propagation of light through crystal 11; while not required, this relationship provides the simplest structural arrangement.

The narrow band light source 17 illustratively provides amplitude modulated light having a wavelength in the preferred range between 4 microns and 35 microns, although the wavelength could also be in the range from 42 microns to longer wavelengths, e.g., 100 microns. Illustratively the source 17 is a carbon dioxide laser of the type described in the copending application of C. K. N. Patel, Ser. No. 495,844, filed Oct. 14, 1965, and assigned to the assignee hereto. Such a laser usually produces radiation having a wavelength of 10.6 microns. The source 17 also illustratively includes lenses suitable for collimating the laser beam to have a width comparable to the thickness of crystal 11 between the supporting arms of members 14 and 15.

For a width of crystal 11 of one centimeter between the supporting arms of members 14 and 15, the direct-current source 24 has a voltage of about 15 volts, although it could be less by an amount that depends upon the steady, or unmodulated, portion of the light from source 17.

The microwave detector 23 is one of the conventional types known in the microwave communication art.

Before proceeding with a description of the details of operation of the embodiment of FIG. 1, a brief explanation will be given of the general theoretical background of Gunn-effect oscillations. In their article "Theory of Negative-Conductance Amplification and of Gunn Instabilities in 'Two-Valley' Semiconductors," IEEE Transactions on Electron Devices, ED–13, 4 (January 1966), D. E. McCumber and A. G. Chynoweth have developed the theory of Gunn-effect oscillation by employing a "two-valley" model. In gallium arsenide, electrons can exist in energy valleys at relatively high energy levels in which they have relatively low mobility in the sense of moving from location to location in the crystal; or they can exist in energy valleys at relatively low energy levels in which they have relatively great mobility in the sense of moving from location to location in the crystal. The upper or low-mobility valleys in gallium arsenide are separated from the lower or high-mobility valley by an energy of about 0.36 electron volt. A direct-current electric field applied to the crystal with a gradient equal to or greater than 3,000 volts per centimeter heats the electrons, i.e., increases their kinetic energy without substantial coupling to the crystalline lattice. Such heating of the electrons, at the voltage gradient level specified, transfers electrons from the lower energy valley to the higher energy valleys in sufficient numbers that the voltage-current characteristic of the crystal as measured between the biasing electrodes exhibits a negative differential conductance of the type illustrated in the second portion of curve 31 of FIG. 2. It is the negative differential conductance which triggers the Gunn-effect oscillations.

It is one broad aspect of our invention that we have recognized that the same sort of heating of the electrons can be achieved in a suitable material such as gallium arsenide by free-carrier absorption. In the wavelength region from about 4 to 35 microns and from about 42 microns to longer wavelengths, the light couples directly to the electrons and very little to the lattice, just as does the applied direct-current electric field. Measurements of the free carrier absorption in the first wavelength range have been reported by W. G. Spitzer and J. M. Whelan, "Infrared Absorption and Electron Effective Mass in N-type Gallium Arsenide," Physical Review, 114, 59 (1959).

Figure 2:
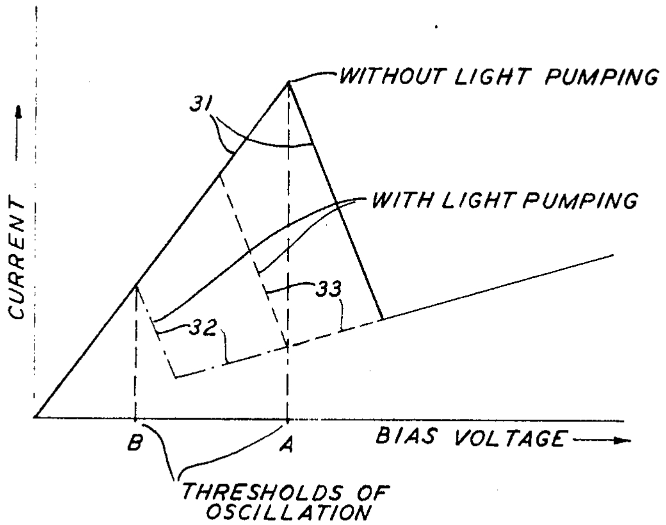
FIG. 2 shows curves that are helpful to an understanding of the theory and operation of the invention.

The energy of the electrons is then relaxed to the lattice through phonon scattering. Compared to the lattice, all the electrons together have a small heat capacity. With the electron-lattice coupling as the bottleneck for electron heat dissipation the electronic temperature may be raised substantially higher than the lattice temperature by either applying the prior art strong electric field or by light-pumping of free carriers, as we propose. Sufficient numbers of electrons are transferred to the high-energy, low-mobility valleys to produce the negative differential conductance. Moreover, the two forms of applied energy have an equivalence for this purpose which permits us to substitute one in part for the other. More specifically, the operation of the embodiment of FIG. 1 may be explained with reference to FIG. 2 as follows:

Without light pumping, the current-voltage characteristic of the crystal 11 can be qualitatively described by solid curve 31 of FIG. 2. It is seen that at a threshold level A, which corresponds to 3,000 volts per centimeter in gallium arsenide, the characteristic starts a region of negative differential conductance. With the application of sufficiently intense light from the source 17, i.e., about 100 watts for a crystal 11 having an impurity concentration of $1 \times 10^{16}$ atoms per cubic centimeter, the current-voltage characteristic of the crystal 11 assumes the modified shape as shown by dot-dash curve 32 of FIG. 2. Curve 32 has a much lower threshold for the start of the region of negative differential conductance. It will be noted that in this region the characteristic has the same slope as before and also has the pre-existing slopes on either side of this region. It can be said that the unmodulated portion of the light from source 17 is supplying an effect equivalent to a biasing voltage having a value equal to the difference between the thresholds A and B. The less impurity concentration in crystal 11, the greater is the intensity of light to be employed.

We prefer to operate the device of FIG. 1 with a bias voltage from source 24 such as to produce a field in the sample of about 3,000 volts per centimeter so that the light from source 17 can have as large a degree of modulation as permits operation to remain in the differential negative conductance region. The effect of this arrangement will be to sustain oscillations in the negative differential conductance region of a current-voltage characteristic that is expanding and contracting but always has a negative differential conductance at the indicated level A of the biasing voltage. It is seen that curve 32 lies outside the desired operating range. Dotted curve 33 represents the lower limit of the desired operating range. The Gunn-effect oscillations are amplitude modulated in response to the amplitude modulation of the light from source 17. The effect is analogous to varying the bias voltage from source 24 by an amount equivalent to the amplitude modulation of the light, so that the operating point is moved up and down the slope of the negative differential conductance region of the characteristic.

It is naturally to be expected that, with such a movement of the operating point, the amplitude of the Gunn-effect oscillations will vary. That is, as the amplitude of the light increases or decreases, the amplitude of the Gunn-effect oscillations will do likewise.

The efficiency of the device with respect to the use of the modulated light is increased by reflecting any unconsumed portion thereof from the mirror 19 back through the crystal 11. The efficiency in this respect could still be further increased by employing the principles of the optical resonator.

The microwave Gunn-effect oscillations are resonated within the cavity resonator 12 and are made readily available to be detected by the microwave probe 22. This technique is considered to be more efficient than the expedient of inserting a sense resistor in series with the source 24. The microwave detector 23 then provides the modulation envelope of the microwave signal as its output signal. That modulation envelope is identical to the modulation envelope from the light from source 17.

Moreover, above the threshold of the Gunn-effect oscillations, the conversion of optical energy to the microwave energy of the oscillation should be quite efficient; and as little as $1 \times 10^{-12}$ watts may be detected by the typical microwave detector 23.

The speed of the detector embodied in FIG. 1 is limited by the time required to build up oscillations, which is of the order of the transit time of a traveling domain, or electric dipole layer, across the sample. As a result, the response time of the detector can be as fast as one-tenth of a nanosecond ($1 \times 10^{-10}$ second).

Figure 3:
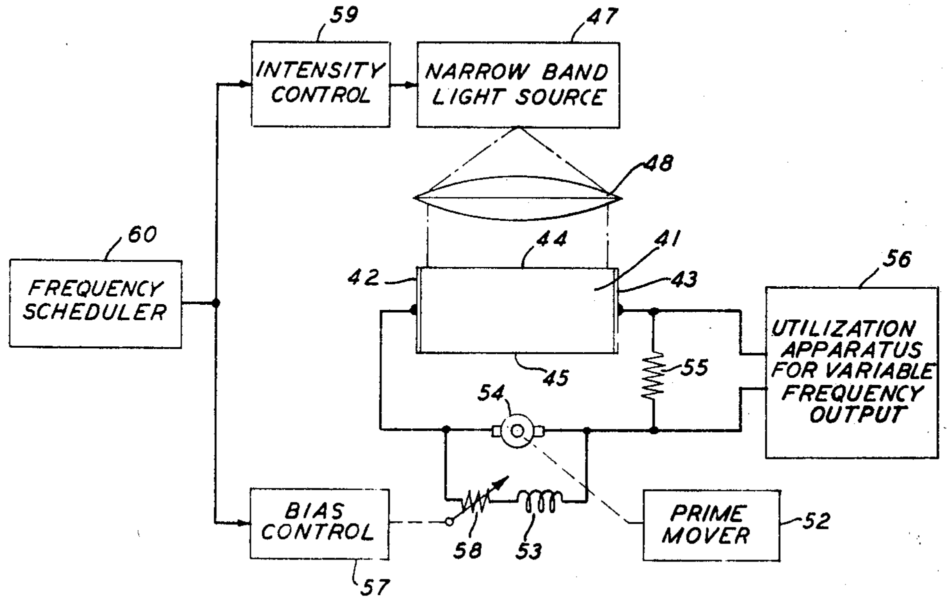
FIG. 3 is a partially pictorial and partially schematic illustration of an embodiment of the invention employed as a variable-frequency oscillator.

A device according to the present invention can be employed as a variable frequency oscillator in the manner shown in the embodiment of FIG. 3. In FIG. 3 a crystal 41 similar in dimensions and other respects to crystal 11 of FIG. 1 is supplied with planar electrodes 42 and 43 upon opposite ends thereof, and has optically flat and parallel surfaces 44 and 45 through which pumping light is to be passed. The pumping light is supplied from a narrow band light source 47 like source 17 of FIG. 1 and is collimated by a lens 48 prior to striking surface 44 of crystal 41. A bias source 54, for example, a direct-current generator is connected serially with an output sense resistor 55 to apply a variable voltage less than 3,000 volts to crystal 41 and is driven by a prime mover 52.

As stated hereinbefore, the frequency of Gunn-effect oscillations depends upon the value of the bias voltage. Therefore, a bias control 57, such as a servo motor, controls the resistance 58 of the field coils 53 to control the generated voltage. Similarly, an intensity control 59, such as a servo motor, controls the size of the output coupling aperture of the light source 47. It is coupled to source 47 in order that the light intensity may be decreased as the direct-current voltage bias is increased, or the light intensity increased as the bias voltage is decreased. A frequency scheduler 60 is coupled both to the bias control 57 and the intensity control 59 in order to cause these variations to occur in the appropriate senses simultaneously. For example, the frequency scheduler 60 may be a potentiometer and direct-current voltage source interconnected so that the variable voltage output is applied to drive the servo motors in the controls 57 and 59 in the appropriate directions.

From curves 31 and 32 of FIG. 2, it may be appreciated that the pumping light intensity and the direct-current bias voltage may be varied in the inverse relationship just described for the embodiment of FIG. 3 while maintaining microwave oscillations of a steady amplitude. Nevertheless, the frequency of the oscillations is uniquely determined by the value of the bias voltage alone so that the control of light source 47 need not be exact so long as oscillations are maintained. The frequency of the oscillations received by the apparatus 56 will vary as the signal from frequency scheduler 60 is varied.

It may readily be appreciated that if the utilization apparatus 56 is the mixing circuit of a superheterodyne receiver, the device supplying it in FIG. 3 is a convenient local oscillator source and may easily be made to track the tuning of the circuits for amplifying the received signal.

Figure 4:
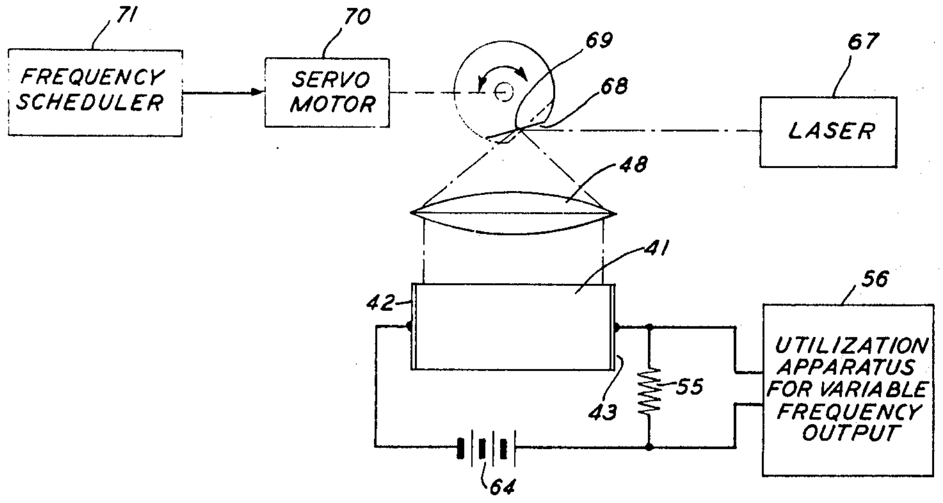
FIG. 4 is a partially pictorial and partially schematic illustration of another embodiment of the invention employed as a variable-frequency oscillator.

Still another technique for varying the freqeuncy of Gunn-effect oscillations is shown in the embodiment of FIG. 4. The crystal 41 with its electrodes 42 and 43 as above-described is biased by a fixed voltage source 64 providing a field gradient of about 3,000 volts per centimeter, or somewhat more, within crystal 41. The output sensing resistor 55 and utilization apparatus 56 may be as above described for FIG. 3.

In the embodiment of FIG. 4, the beam from a carbon dioxide laser 67 is maintained collimated and fairly narrow, i.e., 10 microns in diameter (1 micron$=10^{-4}$ centimeters), in comparison to the 0.005 centimeter dimension of crystal 41 between electrodes 42 and 43 and is deflected by a reflective surface 68 on a rotating cam 69. The cam 69 is driven by a servo motor 70 in response to a frequency scheduler 71, which may be similar to frequency scheduler 60 of FIG. 3. In the position of the reflective surface 68 shown as a solid line in FIG. 4, the beam from laser 67 is directed through lens 48 into crystal 41 near the electrode 42. As the cam 69 is rotated to move the mirror 68 to the position shown dotted, the beam from laser 67 is deflected to pass through lens 48 and strike crystal 41 near electrode 43. Intermediate positions of the light beam within crystal 41 may be attained by driving the cam 69 to a position intermediate those shown.

The operation of this embodiment of the invention in controlling the frequency of Gunn-effect oscillations may be understood as follows: The relatively narrow light beam from $CO_2$ laser 67 serves, in conjunction with the bias, to nucleate a particular electronic configuration within the crystal 41. This electronic configuration we call a dipole layer. It occupies a limited region of differential negative conductance. This dipole layer is then propagated toward the anode 43 at a rate which depends upon the value of the bias supplied by source 64. The moving dipole layer in crystal 41 tends to excite an electromagnetic field between the electrodes 42 and 43 such that when the dipole layer disappears upon arriving at the anode 43, a new one is formed at the location of the light beam. Stated in other terms, the bias and light beam together are effective to induce the limited region of differential negative conductance. Since the transit time of the dipole layer from its site of nucleation to the anode 43 is determined by the spacing therebetween, the period of the microwave oscillations and their frequency can be varied by deflecting the light beam to a new position having a different spacing from the anode 43.

Various modifications of the disclosed embodiments can readily be made; for example, the arrangement of FIG. 4 readily can become a digital device. For example, it can be a pulse-responsive device of the type used in a Touch-Tone telephone set merely by deflecting the light beam in discrete steps. Thus, the position of the cam 69 could be made selectively responsive to the push-buttons of the telephone set in order to send the dial signals of differing frequencies to a central office switching mechanism, which would then be the utilization apparatus 56.

Another modification of the present invention would employ solid state means for deflecting the light beam from laser 67 in an inherently digital manner. For example, such deflection means are disclosed in the copending patent application of T. J. Nelson, Ser. No. 239,948, filed Nov. 26, 1962, and assigned to the assignee hereof. Such an alternative deflection arrangement would generally be of more use in a central office code converter than in a telephone station set because of the bulkiness of the apparatus .

Further, other digital devices such as a character recognition system may be devised employing the principles of the embodiment of FIG. 4. That is, the light beam is discretely deflected by an input signal that is to be tested. The resulting propagation times of the dipole layers can then be compared to the propagation times theoretically expected for the proper signal. Such an arrangement would be extremely fast, since it does not depend on several oscillation cycles to produce the desired indication.

Various other devices suitable for logic or memory functions can be devised in an analogous fashion.

In all cases, the above-described arrangements are illustrative of the many possible specific embodiments that can represent applications of the principles of the invention. Numerous and varied other arrangements can readily be devised in accordance with these principles by those skilled in the art without departing from the spirit and scope of the invention.

What is claimed is:

1. Apparatus for producing microwave oscillations, comprising a two-valley semiconductive body that exhibits a differential negative conductance and microwave oscillations upon application of a direct-current voltage basis upon a threshold level, said semiconductive body having free carriers capable of absorbing electromagnetic wave energy in a wavelength range in which the absorbed wave energy selectively raises the free carrier temperature in a manner similar to that of applied direct-current voltage bias, means for applying a direct-current bias to said body, means for controlling said microwave oscillations comprising means for applying to said body electromagnetic wavelengths in said wavelength range, and means coupled to said body for utilizing said controlled microwave oscillations.

2. Apparatus according to claim 1 in which the semiconductive body comprises gallium arsenide and the wave energy applying means comprises a source of light having a wavelength in one of the ranges between 4 microns and 35 microns and greater than 42 microns.

3. Apparatus according to claim 2 in which the bias applying means applies approximately 3,000 volts per centimeter to the body, the source of light being adapted to provide amplitude modulation of the light to produce amplitude modulation of microwave oscillations dependent upon the differential negative conductance, the utilizing means including means for detecting amplitude modulation of said microwave oscillations.

4. Apparatus according to claim 2 in which the bias applying means applies a variable bias less than 3,000 volts per centimeter to the body and the light source applies light having an amplitude sufficient to induce microwave oscillations in said body, the value of said bias being adjusted to produce a selected frequency of said microwave oscillations.

5. Apparatus according to claim 1 in which the wave energy applying means includes means for collimating the wave energy in a beam that is narrower than the dimension of the body in the direction of application of the bias and includes means for deflecting said beam in said direction of application of said bias.

6. Apparatus according to claim 1 in which the bias applying means applies bias approximately at the threshold level, and the wave energy applying means comprises a source of amplitude modulated light capable of producing amplitude modulated microwave oscillations, said utilizing means including means for detecting the amplitude modulation of said microwave oscillations.

7. Apparatus according to claim 1 in which the wave energy applying means comprises means for forming said wave energy into a beam and means for deflecting said beam along said body in a direction that is appropriate for changing the frequency of oscillations, the bias applying means applying bias sufficient in conjunction with the beam to induce said differential negative conductance in a limited region of said body and to produce microwave oscillations having a frequency responsive to the position of said beam.

References Cited

UNITED STATES PATENTS

| | | | |
|---|---|---|---|
| 3,170,067 | 2/1965 | Kibler | 250—199 |
| 3,200,342 | 8/1965 | Kibler | 331—94.5 |
| 3,262,059 | 7/1966 | Gunn. | |
| 3,267,294 | 8/1966 | Dumke | 331—94.5 |
| 3,365,583 | 1/1968 | Gunn. | |

OTHER REFERENCES

Kuru: Proceedings of the IEEE, Frequency Modulation of the Gunn Oscillator, October 1965, pp. 1642–1643.

ROBERT L. GRIFFIN, *Primary Examiner*

A. J. MAYER, *Assistant Examiner.*

U.S. Cl. X.R.

331—107; 332—7.51